US007592578B2

(12) United States Patent
Shimotsusa et al.

(10) Patent No.: US 7,592,578 B2
(45) Date of Patent: Sep. 22, 2009

(54) PHOTOELECTRIC-CONVERSION APPARATUS AND IMAGE-PICKUP SYSTEM

(75) Inventors: Mineo Shimotsusa, Machida (JP); Shigeru Nishimura, Ebina (JP); Shunsuke Takimoto, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/168,245

(22) Filed: Jul. 7, 2008

(65) Prior Publication Data

US 2009/0011532 A1 Jan. 8, 2009

Related U.S. Application Data

(62) Division of application No. 11/835,009, filed on Aug. 7, 2007, now Pat. No. 7,411,170.

(30) Foreign Application Priority Data

Aug. 31, 2006 (JP) ............................. 2006-235933

(51) Int. Cl.
*H01L 27/00* (2006.01)
*H01L 31/062* (2006.01)

(52) U.S. Cl. ................. 250/208.1; 250/214.1; 257/292; 257/437; 438/72

(58) Field of Classification Search ............. 250/208.1, 250/214.1, 214 R; 257/290–292, 432, 437; 348/300, 301, 308; 438/57, 59, 72
See application file for complete search history.

(56) References Cited

U.S. PATENT DOCUMENTS 5,625,210 A 4/1997 Lee et al. ................... 257/292

| | | | |
|---|---|---|---|
| 6,169,317 B1 | 1/2001 | Sawada et al. | 257/435 |
| 6,177,353 B1 | 1/2001 | Gutsche et al. | 438/704 |
| 7,049,671 B2* | 5/2006 | Kimura | 257/437 |
| 7,126,102 B2 | 10/2006 | Inoue et al. | 250/214 R |
| 7,214,976 B2 | 5/2007 | Uchida et al. | 257/292 |
| 7,259,361 B2 | 8/2007 | Nishimura | 250/208.1 |
| 2004/0188597 A1 | 9/2004 | Inoue et al. | 250/214 R |
| 2004/0188729 A1 | 9/2004 | Uchida et al. | 257/292 |
| 2007/0010808 A1 | 1/2007 | Dahla | 250/214 R |
| 2008/0029793 A1 | 2/2008 | Watanabe et al. | 257/291 |
| 2008/0057615 A1 | 3/2008 | Okagawa et al. | 438/73 |

FOREIGN PATENT DOCUMENTS

JP 2002-368203 12/2002

* cited by examiner

*Primary Examiner*—Kevin Pyo
(74) *Attorney, Agent, or Firm*—Fitzpatrick, Cella, Harper & Scinto (57) ABSTRACT

A photoelectric-conversion apparatus includes a photoelectric-conversion area where a plurality of photoelectric-conversion elements configured to convert incident light into electrical charges, a plurality of floating-diffusion areas, a plurality of transfer-MOS transistors configured to transfer electrical charges of the photoelectric-conversion element to the floating-diffusion area, and a plurality of amplification-MOS transistors configured to read and transmit a signal generated based on the transferred electrical charges to an output line are provided. An antireflection film is provided on a light-receiving surface of the photoelectric-conversion element. The gate of the amplification-MOS transistor is electrically connected to one floating-diffusion area by providing one conductor in a single contact hole, and the anti-reflection film covers the photoelectric-conversion area except a base part of the contact hole.

3 Claims, 5 Drawing Sheets

PHOTOELECTRIC-CONVERSION APPARATUS AND IMAGE-PICKUP SYSTEM

CROSS REFERENCE TO RELATED APPLICATION

This application is a division of U.S. application Ser. No. 11/835,009, filed Aug. 7, 2007, the entire disclosure of which is hereby incorporated by reference herein.

BACKGROUND OF THE INVENTION

1. Field of the Invention

The present invention relates to a photoelectric-conversion apparatus and particularly relates to a metal oxide semiconductor (MOS) photoelectric-conversion apparatus.

2. Description of the Related Art

Photoelectric-conversion apparatuses have been rapidly growing in demand, as image-pickup devices of two-dimensional-image-input devices, notably digital-still cameras and video camcoders and/or one-dimensional-image readers, notably facsimiles and scanners. In the above-described photoelectric-conversion apparatuses, MOS-photoelectric-conversion apparatuses using a MOS transistor are used, so as to read a signal. In the MOS-photoelectric-conversion apparatus, both a photoelectric-conversion area and a peripheral-circuit area can be formed at the same time by performing complementary metal oxide semiconductor (CMOS)-manufacturing processing. Therefore, the MOS-photoelectric-conversion apparatus can be formed by performing a manufacturing processing that is easier than that performed for manufacturing a charge-coupled device (CCD).

When performing the CMOS-manufacturing processing, a contact configured to electrically connect a semiconductor area provided on a semiconductor substrate and/or a gate electrode of a transistor to upper wiring is used.

A shared contact is used for connecting the semiconductor area to the gate electrode by using a single conductor without concern for the two-dimensional distance between the semiconductor area and the gate electrode that are connected to the contact and/or the two-dimensional distance between contacts. The above-described technology is often used for a static random access memory (SRAM), since the technology is advantageous to form a smaller semiconductor device by doing layout.

Japanese Patent Laid-Open No. 2002-368203 discloses an example where the above-described shared contact is used for forming a CCD-photoelectric-conversion apparatus. According to Japanese Patent Laid-Open No. 2002-368203, the shared contact is included in an output-buffer circuit having a MOS transistor in which a gate-electrode unit is electrically connected to a floating-diffusion area, as a drive transistor. Subsequently, an electrical-charge-conversion coefficient is increased due to a reduced capacity.

According to Japanese Patent Laid-Open No. 2002-368203, the shared contact is provided in an output unit of a horizontal CCD, and provided in an area different from a photoelectric-conversion area where a photoelectric-conversion element such as a photodiode is formed. On the other hand, through investigations performed by inventors of the present invention, a new problem is found, the new problem being caused by providing the shared contact in the photoelectric-conversion area where the photoelectric-conversion element is provided.

The area of a contact hole used to form the shared contact should be larger than that of a contact hole used to form an ordinary contact. In that case, the etching rate of the contact hole used to form the shared contact becomes higher than that of the contact hole used to form the ordinary contact due to the microloading effect. Subsequently, the overetching amount of a contact-hole unit used to form the shared contact becomes larger than in the case where the ordinary contact hole is formed. When the overetching amount is increased in the photoelectric-conversion area where the photoelectric-conversion element is provided, an increased number of noises to the photoelectric-conversion element are produced and the image quality deteriorates.

Accordingly, the present invention has been achieved, so as to use a shared contact in a photoelectric-conversion area without increasing a noise to a photoelectric-conversion element.

SUMMARY OF THE INVENTION

For solving the above-described problems, a photoelectric-conversion apparatus according to an embodiment of the present invention includes a photoelectric-conversion area having a plurality of photoelectric-conversion elements configured to convert incident light into electrical charges, a plurality of floating-diffusion areas, a plurality of transfer-MOS transistors configured to transfer electrical charges of the photoelectric-conversion element to the floating-diffusion area, a plurality of amplification-MOS transistors configured to read and transmit a signal generated based on the transferred electrical charges to an output line, and an antireflection film provided on a light-receiving surface of the photoelectric-conversion element and a plurality of wiring layers. One gate of the amplification-MOS transistor is electrically connected to one floating-diffusion area by one conductor provided in a single contact hole, where the electrical connection is not via the plurality of wiring layers, and the antireflection film is provided, so as to cover at least a part of each of an upper part of the floating-diffusion area and an upper part of the gate of the amplification-MOS transistor except the base part of the contact hole.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DESCRIPTION OF THE EMBODIMENTS

The configurations of embodiments of the present invention will be described. According to an embodiment of the present invention, a photoelectric-conversion area is an area where a plurality of photoelectric-conversion elements and metal-oxide-semiconductor (MOS) transistors configured to read a signal generated based on an electrical charge of the photoelectric-conversion element are provided. A plurality of the MOS transistors may be provided for each of the photoelectric-conversion elements so that the electrical charge can be amplified.

A peripheral-circuit area is an area where a circuit configured to drive the MOS transistors provided on the above-described photoelectric-conversion area, a circuit configured to amplify a signal transmitted from the photoelectric-conversion area, and so forth are provided.

Figure 1:
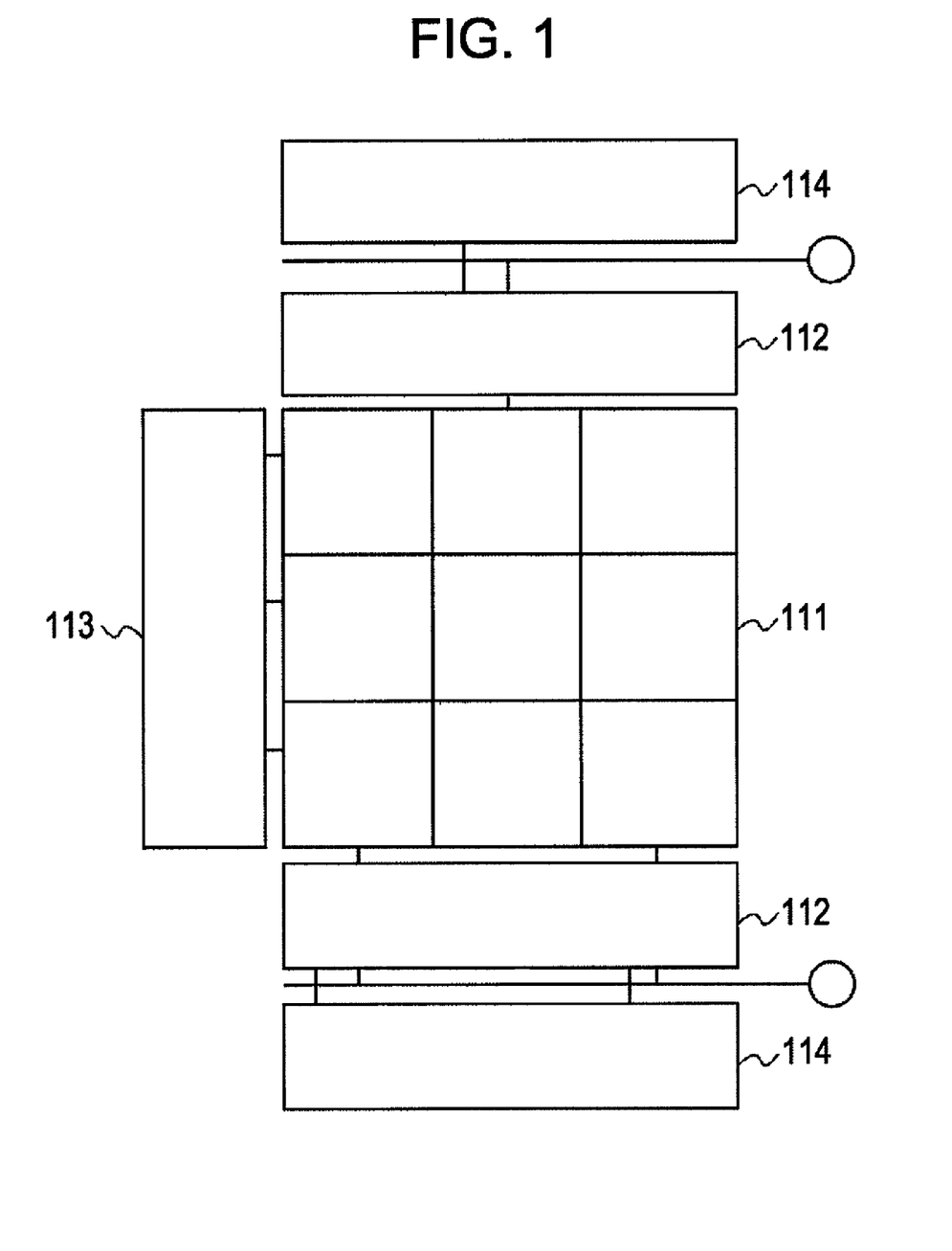
FIG. 1 is an example schematic plan view of a photoelectric-conversion apparatus according to an embodiment of the present invention.

FIG. 1 shows a plan view of a photoelectric-conversion apparatus. A photoelectric-conversion area 111 is provided. If the unit of a signal read from a single photoelectric-conversion element is determined to be a pixel, an area where electric-conversion elements are provided may be referred to as a pixel area. The pixel is the minimum unit of a single photoelectric-conversion element and an element assembly provided to read a signal from the photoelectric-conversion element and transmit the read signal to an output line. The element assembly includes a single photoelectric-conversion element and a single transfer-MOS transistor. Further, a single floating-diffusion area, a single amplification unit including an amplification-MOS transistor or the like, and a single reset unit including a reset-MOS transistor or the like are provided in each of the element assemblies. The elements included in the element assembly can be shared between at least two photoelectric-conversion elements adjacent to each other. In that case, the pixel is also defined as the minimum unit of the element assembly configured to read a signal of a single photoelectric-conversion element.

A signal-processing circuit 112 is provided to amplify the signal read from the photoelectric-conversion area 111. However, the signal-processing circuit may be provided, as not only an amplification circuit but also a circuit configured to remove a noise of a pixel by performing correlated-double-sampling (CDS) processing. Further, the signal-processing circuit may simply be a circuit configured to convert signals read from a plurality of columns in parallel into serial signals.

A vertical-shift register 113 is configured to drive the MOS transistor provided in the photoelectric-conversion area 111. A horizontal-shift register 114 is configured to drive the MOS transistor of the signal-processing circuit 112. The signal-processing circuit 112, the vertical-shift register 113, and the horizontal-shift register 114 may be included in the peripheral-circuit area. Further, when analog-to-digital (AD) conversion is performed in the photoelectric-conversion apparatus, an AD-conversion circuit may be included in the peripheral-circuit area.

According to an embodiment of the present invention, a gate electrode of the amplification-MOS transistor provided in the photoelectric-conversion area is connected to the floating-diffusion area by embedding a conductor in a single contact hole, where the electrical connection is not via the plurality of wiring layer. Then, an antireflection film is provided on the light-receiving surface of the photoelectric-conversion element, so as to cover the photoelectric-conversion area 111 except the base part of the above-described contact hole.

Hereinafter, embodiments of the present invention will be described in detail with reference to the attached drawings.

First Embodiment

Figure 2:
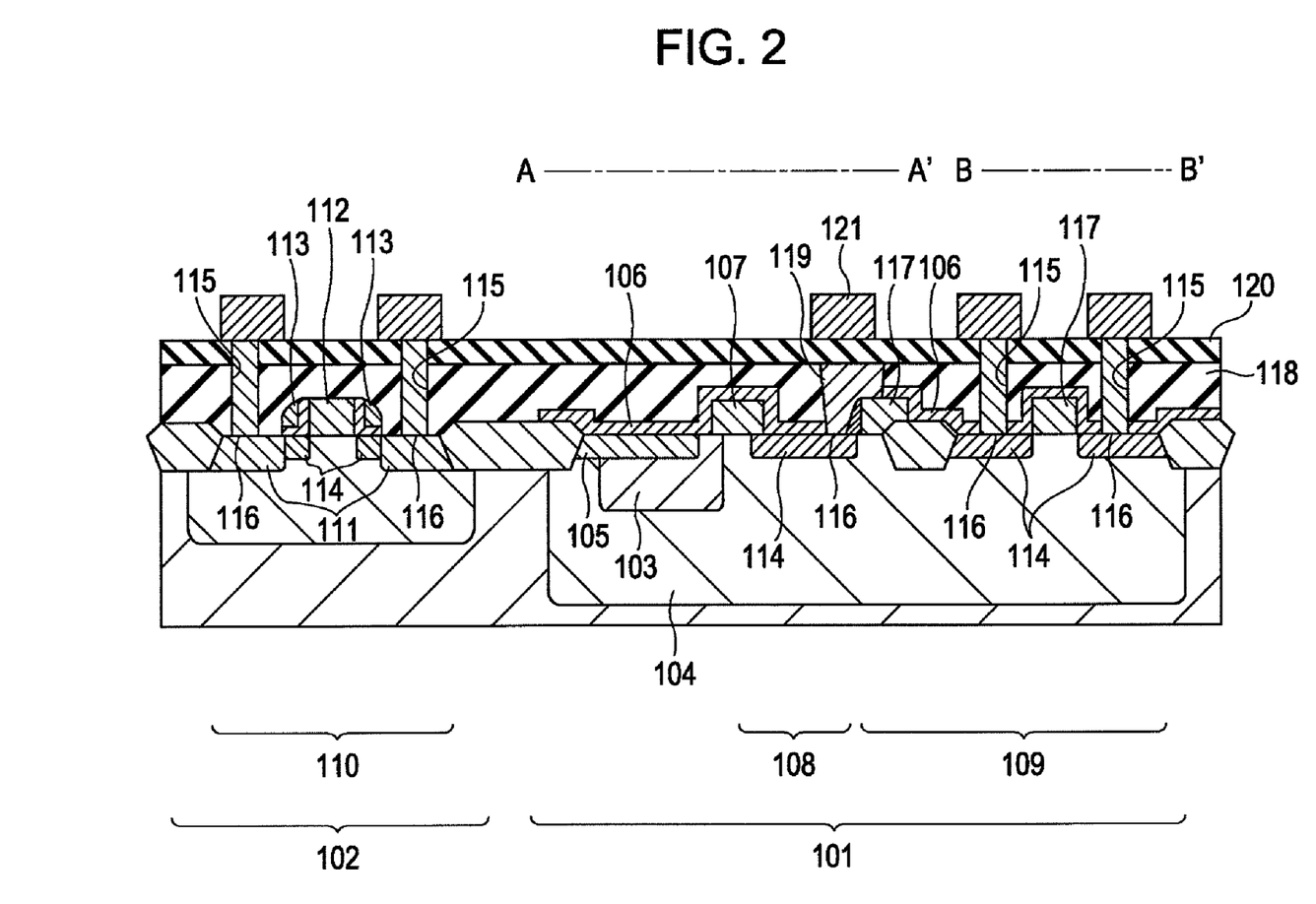
FIG. 2 is a schematic sectional view showing the configuration of a photoelectric-conversion apparatus according to a first embodiment of the present invention.
Figure 3:
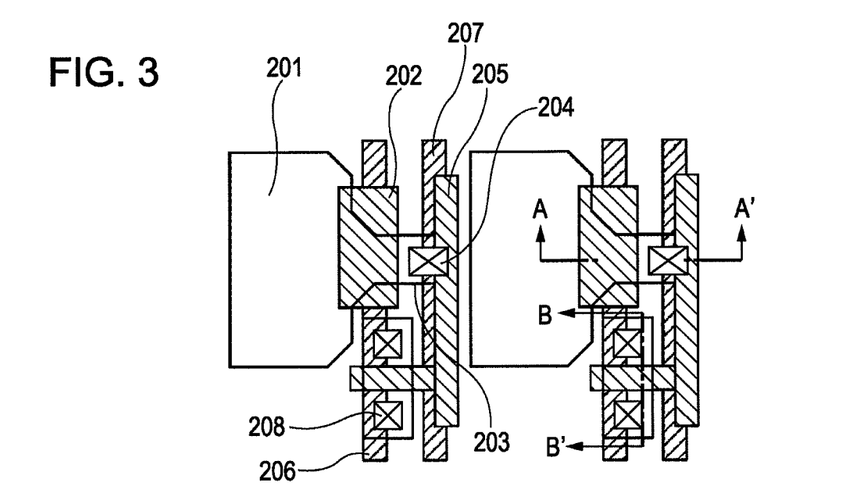
FIG. 3 is a schematic plan view showing the configuration of the photoelectric-conversion apparatus according to the first embodiment.

FIG. 2 shows a schematic sectional view of configurations of a photoelectric-conversion area and a peripheral-circuit area of a photoelectric-conversion device. FIG. 3 shows a plan view of the photoelectric-conversion area. As shown in FIG. 2, a photoelectric-conversion area 101 and a peripheral-circuit area 102 are provided. FIG. 2 is a sectional view of the photoelectric-conversion area 101 cut along lines A-A' and B-B'.

A semiconductor area 103 of the first conductive type and a part of a semiconductor area 104 of the second conductive type generate a photodiode functioning as a photoelectric-conversion element. The first-conductive-type semiconductor area 103 is of the same conductive type of that of a signal charge. When the signal charge is an electron, the first-conductive type semiconductor area 103 becomes an N-type semiconductor area. A semiconductor area 105 of the second conductive type is provided to reduce a dark current. Further, an optical antireflection film 106 is provided on the light-receiving surface of the photodiode, so as to reduce interface reflection which occurs on the surface of the photodiode. The antireflection film 106 may have a laminate including silicon nitride (SiN) and silicon monoxide (SiO). The antireflection film 106 covers the photoelectric-conversion area 101 except the base part of a contact hole which will be described later. Here, it is preferable that the antireflection film 106 cover the entire photoelectric-conversion area 101. However, the antireflection film 106 should cover at least the light-receiving surface of the photoelectric-conversion element, the top face of an electrode where a shared contact is formed, and a part of the top face of the semiconductor area where the shared contact is formed.

Specifically, the gate of the amplification-MOS transistor and the floating-diffusion area are electrically connected to each other by the shared contact. By arranging the antireflection film 106 in the above-described manner, it becomes possible to reduce damage to a semiconductor substrate, the damage being caused by overetching performed at the time where a contact hole used to form the shared contact is formed. Further, it is preferable that the antireflection film 106 be provided, so as not to cover the base part of a contact other than the shared contact provided in the photoelectric-conversion area 101. The contact other than the shared contact includes a contact provided to connect the gate of each of the MOS transistors to wiring. The contact other than the shared contact further includes a contact provided to connect the drain of each of the reset-MOS transistor and the amplification-MOS transistor to power wiring. Still further, the contact other than the shared contact includes a contact connecting the source of the amplification-MOS transistor to signal wiring.

Further, the antireflection film 106 may be provided, so as not to cover at least a single part of an element-isolation area provided on the photoelectric-conversion area 101. Further, since the MOS transistors provided on the peripheral-circuit area have a lightly-doped-drain (LDD) structure, it is preferable that the antireflection film 106 be provided, so as not to cover the peripheral-circuit area.

A gate 107 of the transfer-MOS transistor is provided to transfer an electrical charge of the semiconductor area 103. A semiconductor area 108 is of the first conductive type and an area to which the transfer-MOS transistor transfers an electrical charge. Since a voltage changing based on the transferred electrical charge is read, as described later, the first-conductive-semiconductor area 108 can be referred to as an electrical charge-to-voltage conversion unit. Further, when an electrical charge is transferred by the transfer-MOS transistor, the first conductive type-semiconductor area 108 is in an electrically-floating state. Therefore, the first-conductive-semiconductor area 108 may be referred to as a floating-diffusion (hereinafter referred to as FD) area. A voltage signal is read and transmitted to a signal line by the amplification-MOS transistor provided on the photoelectric-conversion area 101. After that, a read circuit including a MOS transistor 110 provided on the peripheral-circuit area 102 reads the voltage signal outside the photoelectric-conversion apparatus.

According to the first embodiment, an electrical connection between the FD area 108 and a gate 117 of the amplification-MOS transistor is achieved by a conductor (shared contact) 119 provided in one and the same contact hole. The shared contact may be referred to as an interconnect.

Next, a schematic plan view of FIG. 3 will be described. A photoelectric-conversion element 201, a gate 202 of the transfer-MOS transistor, an FD area 203, which is the drain of the transfer-MOS transistor, and a gate 205 of the amplification-MOS transistor are provided. The gate 205 includes not only a part provided on the channel of the MOS transistor but also a wiring part provided on the element-isolation area.

The electrical connection between the FD 203 and the gate 205 of the amplification-MOS transistor is achieved by a shared contact 204. The gate 205 of the amplification-MOS transistor actually comes in contact with the shared contact at a part provided on the element-isolation area.

The shared contact may include tungsten, amorphous silicon, polysilicon, and so forth. Further, when metal is used to form the shared contact, the metal and a barrier-metal material including titanium, titanium nitride, tantalum, and so forth may be stacked onto each other. The barrier-metal material is used to prevent metallic elements from being diffused due to heat treatment. When the electrical connection between the FD AREA 108 and the gate 117 of the amplification-MOS transistor is achieved by using the shared contact, the wiring space required to perform wiring connection can be reduced. Further, when the amplification-MOS transistor is shared between adjacent photoelectric-conversion elements, as described later, different wiring used to connect the adjacent photoelectric-conversion elements and the amplification-MOS transistor to one another is required, which reduces the aperture ratio. On the other hand, the use of the shared contact allows the amplification-MOS transistor to be shared between the adjacent photoelectric-conversion elements without decreasing the aperture ratio. Further, the number of contact holes can be reduced.

However, when the shared contact is used, it is preferable that the area of the contact hole be increased. In that case, the etching rate of the contact hole used to form the shared contact becomes larger than that of an ordinary contact hole due to a microloading effect. Therefore, it is highly possible that the overetching amount of the contact hole used to form the shared contact becomes larger than that of the ordinary contact hole. When the overetching amount is increased while the contact hole is formed, the increase causes the element characteristic to deteriorate. Particularly, noise occurs in the photoelectric-conversion element due to a defect occurring on the semiconductor substrate. Therefore, the overetching exerts a bad influence on a part near the photoelectric-conversion element. It is difficult to connect the FD AREA 108 to the gate 117 of the amplification-MOS transistor at a part significantly distant from the photoelectric-conversion element due to the above-described configuration. Therefore, when the overetching is performed, it is difficult to reduce an influence exerted upon the photoelectric-conversion element.

On the other hand, when an antireflection film reducing the interface reflection of light incident upon a light-receiving surface is provided, so as to cover a photoelectric-conversion area, as in the first embodiment, the antireflection film area, reduces the influence of the overetching. Subsequently, it becomes possible to achieve smaller elements that construct the photoelectric-conversion apparatus by using the shared contact while reducing the overetching influence.

Further, the MOS transistor 110 provided on the peripheral-circuit area may have the LDD structure, as shown in FIG. 2. At that time, part of the MOS transistors provided on the photoelectric-conversion area may also have the LDD structure. However, according to the first embodiment, the configurations of the MOS transistors provided on the photoelectric-conversion area are different from those of the MOS transistors provided on the peripheral-circuit area.

For example, a semiconductor area 111 of the first conductive type with a high impurity density, the first conductive-semiconductor area 111 being provided for the drain of the MOS transistor provided on the peripheral-circuit area, is not formed on the FD AREA 108 and the source-and-drain area of the amplification-MOS transistor 109. A drain is formed by using a semiconductor area 114 of the first conductive type with a low impurity density. However, in an area electrically connected to a wiring layer, a semiconductor area 116 of the first conductive type with a high impurity density is formed under a contact hole 115 and/or a shared contact 119, so as to obtain an appropriate electrical connection.

Here, the MOS transistor provided on the peripheral-circuit area has the LDD structure, as described above, and a side spacer 113 is provided at the gate of the MOS transistor. The side spacer 113 may be formed by using one and the same layer as that of the antireflection film 106 in the following manner. Namely, the antireflection film 106 is formed so that the antireflection film 106 covers the photoelectric-conversion area and the peripheral-circuit area, the photoelectric-conversion area is protected by using a mask, and the entire peripheral-circuit area is etched so that the side spacer 113 is formed.

Semiconductor areas 114 may be formed so that the semiconductor areas 114 are self-aligned with gate electrodes 107, 112, and 117. Further, the semiconductor area 114 is also formed under the side spacer 113 of the peripheral-circuit area, and the first conductive-semiconductor areas 111 may be formed so that the first conductive-semiconductor areas 111 are self-aligned with the side spacers 113. According to the configuration shown in FIG. 2, the first conductive-semiconductor area 111 is not formed on an area covered by the side spacer 113 and the antireflection film 106. Namely, the antireflection film 106 functions, as a mask used to perform ion injection. The first conductive-type semiconductor area 111 with the high impurity density is not formed on the source, the drain, and the FD of the MOS transistor provided on the photoelectric-conversion area, but only the first conductive-type semiconductor area 114 with the low impurity density is formed thereon.

When the antireflection film 106 is not etched on the photoelectric-conversion area, as described above, a damage caused by the etching to the photoelectric-conversion element can be reduced. Further, after the antireflection film 106 is formed, no processing procedure is performed, so as to expose the semiconductor surface. Namely, there is no way to expose the semiconductor surface except by the use of contact holes. Therefore, contaminations caused by metallic elements or the like can be reduced. Subsequently, the occurrence rate of point defects, the point defects occurring at the dark time, can be reduced.

Further, when the MOS transistor provided on the peripheral-circuit area has the LDD structure and the drain of the MOS transistor provided on the photoelectric-conversion area is formed, as a semiconductor area with the same impurity density as that of the LDD area of the peripheral-circuit area, as described in the above-described embodiment, the following effects can be achieved.

In general, in a MOS transistor having the LDD structure, electric-field relaxation can be achieved in an electric-field-relaxation layer with a low density such as the first conductive-type semiconductor area 114 described in the above-described embodiment. The electric-field-relaxation effect can be increased by reducing the density and/or designing a low-density area having a larger width than before. Subsequently, the occurrence of a hot carrier can be reduced and the reliability and pressure resistance of the MOS transistor can be increased.

However, when the density of the electric-field-relaxation layer is inappropriately low and the width thereof is inappropriately large, a parasitic resistance or a series resistance of the MOS transistor increases, which significantly damages the driving power and static characteristic of the MOS transistor. Therefore, in the peripheral-circuit area where the drive power and/or the circuit property is important, the width of the electric-field-relaxation layer should be relatively small. On the other hand, in the photoelectric-conversion area where the electric field should be relaxed so that smaller elements that construct the photoelectric-conversion apparatus are obtained, for example, the electric-field-relaxation area should be increased in width.

According to the first embodiment, the width of the electric-field-relaxation layer of the peripheral-circuit area can be relatively small and the electric-field-relaxation area of the photoelectric-conversion area can be increased. In the MOS transistor provided in the photoelectric-conversion area of the first embodiment, a part having an actual electric-field-relaxation effect extends from the end of each of the gates 107 and 117 to the first conductive-type semiconductor area 116 with the high impurity density, the first conductive-semiconductor area 116 being formed under the contact hole 115 and the shared contact 119. The distance from the end of each of the gates 107 and 117 to the area where the impurity density is high can be larger than the MOS transistor provided on the peripheral-circuit area. Subsequently, a large electric-field-relaxation effect can be obtained. Here, the first conductive-semiconductor areas 116 with the high impurity density can be formed by forming holes including the contact holes 115 and the shared contact 119 and injecting ions through the holes so that the first conductive-semiconductor areas 116 are self-aligned with the contact holes. Subsequently, it becomes possible to design a transistor in a reduced size. It is preferable that the first conductive-type semiconductor areas 116 with the high impurity density be formed, so as to obtain an appropriate electrical connection.

Further, when the entire FD area 108 is formed, as an electric-field-relaxation area with a low density (the first conductive-type semiconductor area 114 with the low impurity density), a pixel defect and a random noise that are caused by the leakage of the FD area 108 can be decreased. This is because an electric field generated in each of a PN junction formed between the second conductive-type semiconductor area 104 and the first conductive-type semiconductor area 114, and a junction formed between a channel-stop layer (not shown) formed under the element-isolation area and the first conductive-type semiconductor area 114 can be relaxed. Further, it is an empirical fact that there is a correlation between the probability of a sudden occurrence of a large pixel, the sudden large-pixel occurrence being caused by a leakage current of the FD area 108, and the electric field of the FD area 108. Further, point defects can also be reduced.

Further, the antireflection film 106 may include a silicon-nitride film including hydrogen. In that case, it becomes possible to reduce traps occurring on the interface of a transistor and/or the interface of a silicon/silicon-oxide film provided on the surface of the photoelectric-conversion element effectively.

Further, the MOS transistors provided on the peripheral-circuit area are of the same conductive types as those of the MOS transistors provided on the photoelectric-conversion area, for example. However, each of the MOS transistors provided on the peripheral-circuit area may have a complementary-metal-oxide-semiconductor (CMOS) configuration. A MOS transistor of a conductive type opposite to that of each of the MOS transistors provided on the photoelectric-conversion area may have a side-spacer configuration. The above-described effects have a significant impact on an n-type MOS transistor where hot carriers tend to occur. When each of the MOS transistors provided on the photoelectric-conversion area and the peripheral-circuit area is the n-type MOS transistor, a significantly large effect can be obtained.

However, when each of the MOS transistors provided on the photoelectric-conversion area is a P-type MOS transistor, the hot-carrier problems becomes less significant. However, it becomes easy to work on a fine pixel.

As described above, in the photoelectric-conversion apparatus according to the first embodiment, the FD area and the gate of the amplification-MOS transistor are electrically connected to each other through the shared contact and the photoelectric-conversion area is covered by the antireflection film provided on the light-receiving surface of the photoelectric-conversion element. Subsequently, a fine element can be easily formed and deterioration of the element characteristic can be reduced, the deterioration being caused by overetching performed when a contact hole used to form the shared contact is formed.

It is preferable that each of the MOS transistors have the configuration described in the above-described embodiment. However, without being limited to the above-described embodiment, each of the MOS transistors may have a different configuration. For example, each of the MOS transistors provided on the photoelectric-conversion area may have the same configuration as that of each of the MOS transistors provided on the peripheral-circuit area. Further, the antireflection film may not be the silicon-nitride film.

Second Embodiment

Figure 4:
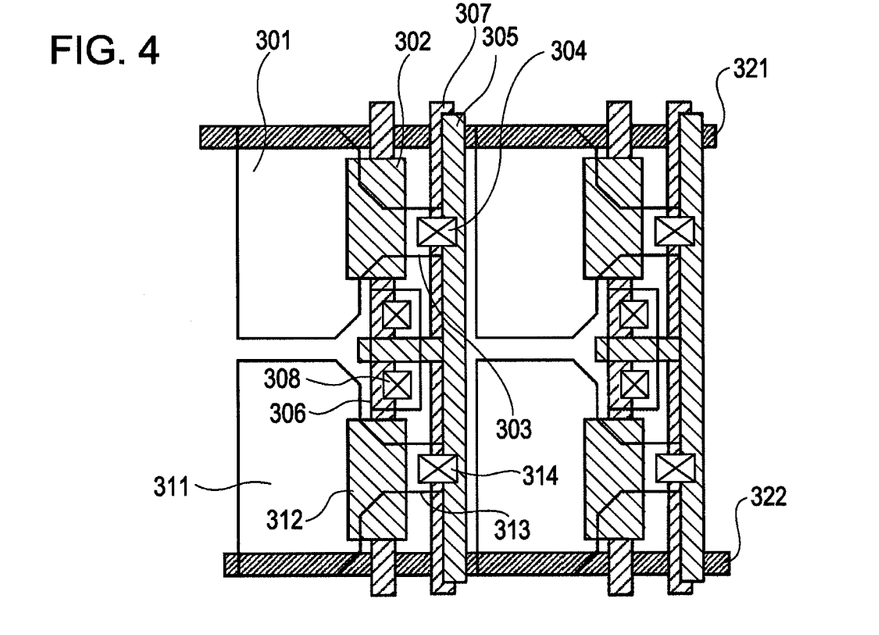
FIG. 4 is a schematic plan view showing the configuration of a photoelectric-conversion apparatus according to a second embodiment of the present invention.

FIG. 4 is a schematic plan view of a photoelectric-conversion area of a photoelectric-conversion apparatus according to a second embodiment of the present invention. The above-described photoelectric-conversion area is different from the photoelectric-conversion area according to the first embodiment in that each of the amplification-MOS transistor and the reset-MOS transistor is shared among a plurality of photoelectric-conversion elements, for example. However, at least a transfer-MOS transistor may be provided for each of the photoelectric-conversion elements and an amplification transistor may be provided and shared between at least two photoelectric-conversion elements.

Figure 5:
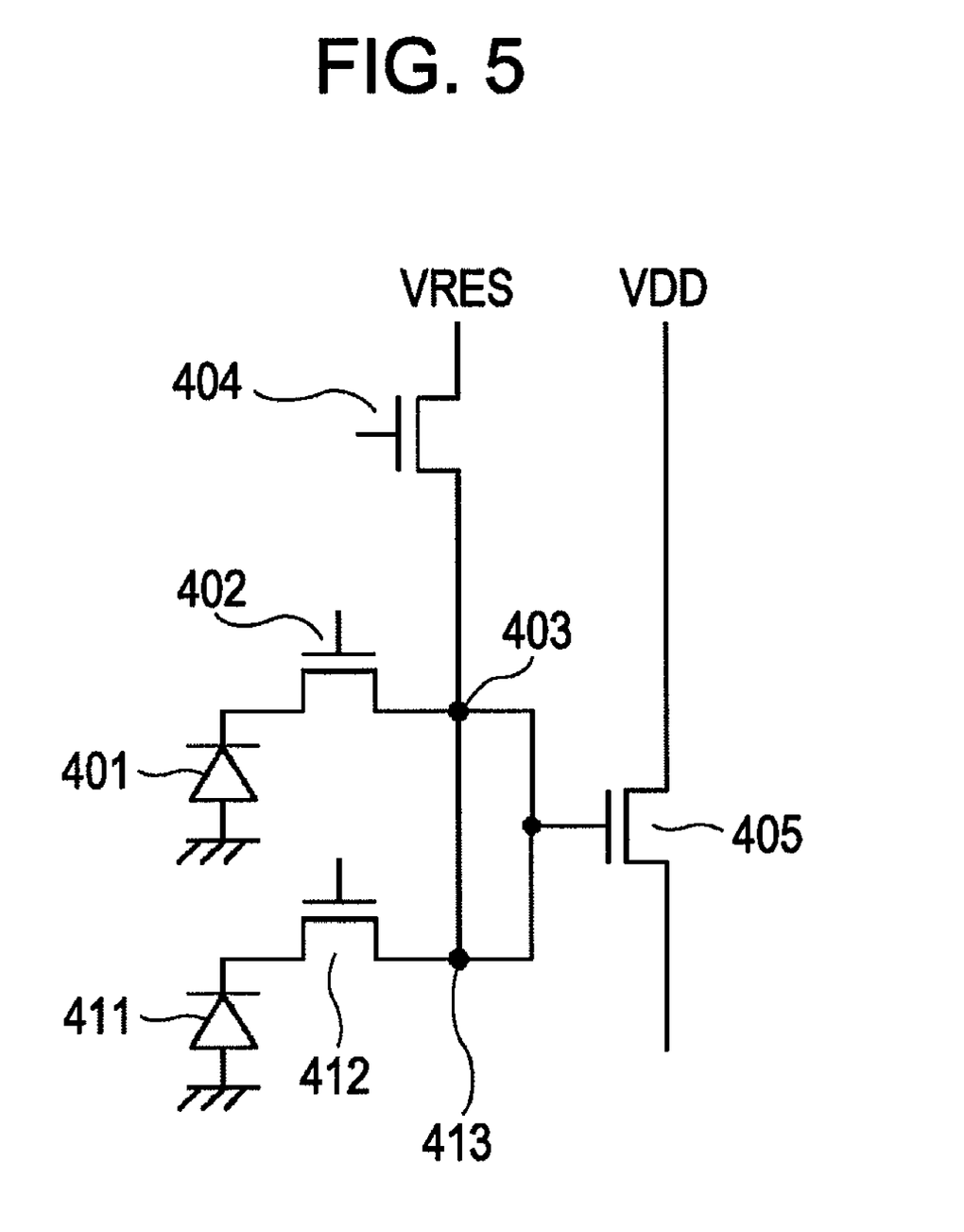
FIG. 5 is an equivalent-circuit diagram showing the configuration of the photoelectric-conversion apparatus according to the second embodiment.

An electrical charge of each of photodiodes 301 and 311 functioning, as the photoelectric-conversion elements, is transferred to FD areas 303 and 313 through gates 302 and 312 of the transfer-MOS transistors. The transferred electrical charges are converted into voltage signals through the FD areas 303 and 313. The voltage signals are read by an amplification-MOS transistor 308 forming part of a source-follower circuit, and read and transmitted to the peripheral-circuit area. According to the second embodiment, an electrical connection between the FD areas 303 and 313, and a gate 305 of the amplification-MOS transistor 308 is achieved by shared contacts 304 and 314 that area formed by using one and the same contact hole. FIG. 5 shows the above-described configuration, as an equivalent-circuit diagram. The FD areas 303 and 313 are connected to the gate 305 of the amplification-MOS transistor 308 by using the shared contacts 304 and 314 formed by embedding conductors in one and the same contact hole. Further, the amplification-MOS transistor 308 is shared by the plurality of photoelectric-conversion elements, whereby the photoelectric-conversion area can be reduced in size. Further, as shown in FIG. 5, by sharing a reset-MOS transistor 404 used to reset photo diodes 401 and 411, and FD areas 403 and 413, the photoelectric-conversion area can further be reduced in size.

Thus, the second embodiment is applied to the two different photoelectric-conversion elements. However, the second embodiment can also be applied to two or more photoelectric-conversion elements.

(Example Image-Pickup System)

Figure 6:
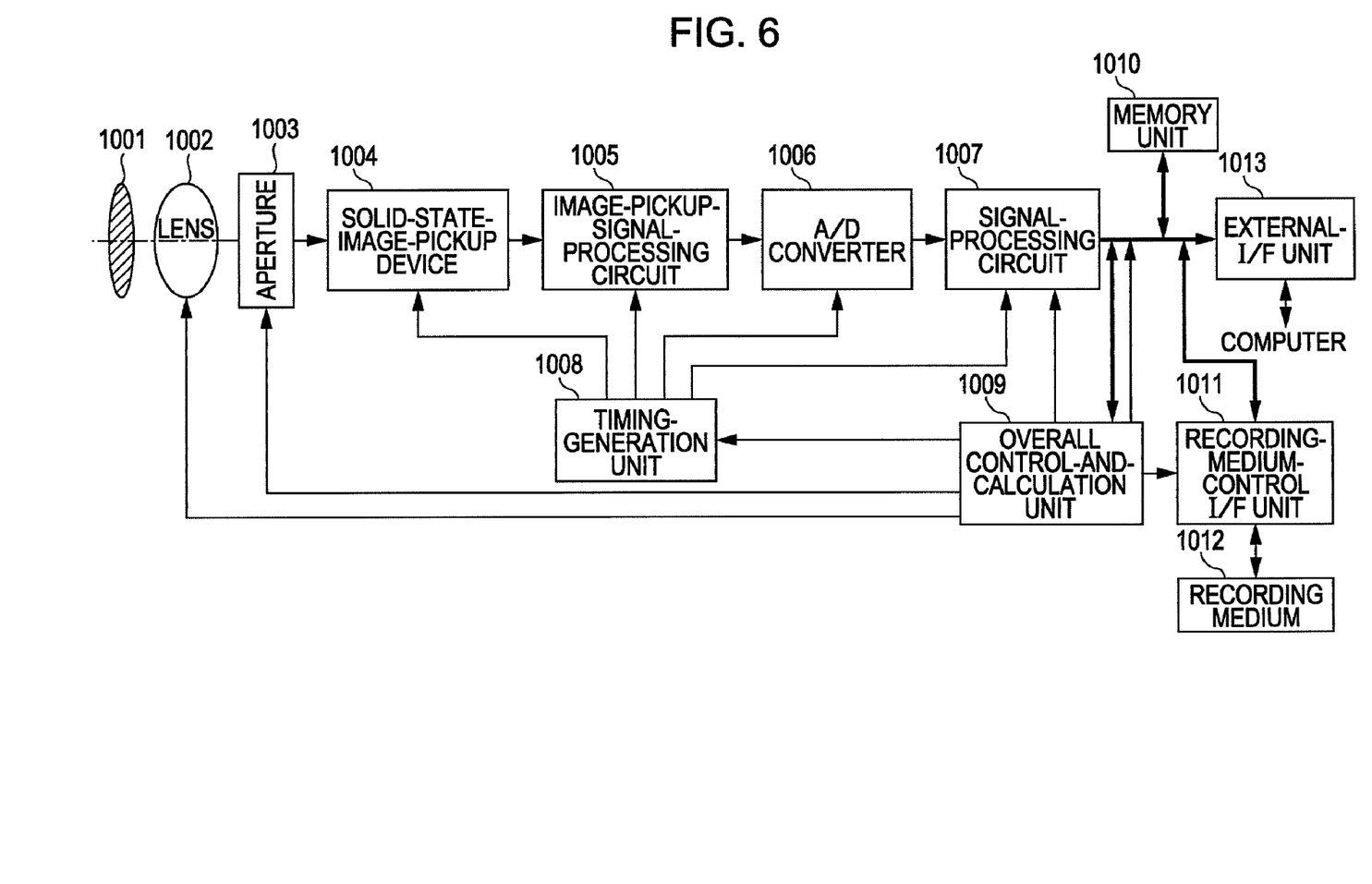
FIG. 6 is a block diagram illustrating an image-pickup system.

FIG. 6 shows an example circuit-block diagram where the above-described photoelectric-conversion apparatus is applied to an image-pickup system including a camera or the like. A shutter 1001 is provided in front of an imaging lens 1002, so as to control an exposure. The light amount is controlled by an aperture 1003, as required, and an image is formed in a photoelectric-conversion apparatus 1004. A signal externally transmitted from the photoelectric-conversion apparatus 1004 is processed by an image-pickup-signal-processing circuit 1005. The externally transmitted signal, which is an analog signal, is converted into a digital signal by an analog-to-digital (A/D) converter 1006. Further, the digital signal is subjected to calculation processing by a signal-processing unit 1007. The processed digital signal is accumulated on a memory 1010 and/or transmitted to an external device via an external interface (I/F) 1013. The photoelectric-conversion apparatus 1004, the image-pickup-signal-processing circuit 1005, the A/D converter 1006, and the signal-processing unit 1007 are controlled by a timing-generation unit 1008. The overall system is controlled by an overall control-and-calculation unit 1009. The externally-transmitted digital signal is recorded through a recording-medium-control I/F unit 1011 controlled by the overall-control-and-calculation unit 1009, so as to record an image onto a recording medium 1012.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-235933 filed on Aug. 31, 2006, which is hereby incorporated by reference herein in its entirety.

What is claimed is:

1. A method for manufacturing a photoelectric-conversion apparatus that includes: a photoelectric-conversion area having a plurality of photoelectric-conversion elements configured to convert incident light into electrical charges; a plurality of floating-diffusion areas; a plurality of transfer-MOS transistors configured to respectively transfer electrical charges of the plurality of photoelectric-conversion element to the plurality of floating-diffusion areas; a plurality of amplification-MOS transistors each configured to read and transmit a signal generated based on transferred electrical charges to an output line; and an antireflection film provided on a light-receiving surface of each photoelectric-conversion element, wherein the method comprises steps of:

forming said antireflection film to cover a light-receiving surface of a photoelectric conversion element, a gate of a corresponding amplification-MOS transistor, and a corresponding floating diffusion area;

forming a single contact hole in an area corresponding to the gate of the corresponding amplification-MOS transistor and the corresponding floating diffusion area;

etching the antireflection film provided at a base part of the single contact hole; and embedding a conductor in the single contact hole.

2. The method according to claim 1, wherein the photoelectric-conversion apparatus includes a peripheral-circuit area where a second MOS transistor is provided, the second MOS transistor being configured to perform at least one of driving of MOS transistors provided on the photoelectric-conversion area and amplification of a signal read from the photoelectric-conversion area, said method further comprising a step of forming a side spacer of the second MOS transistor by the antireflection film.

3. The method according to claim 2, wherein the step of forming the side spacer includes:

forming the antireflection film to cover the photoelectric-conversion area and the peripheral circuit area;

protecting the photoelectric-conversion area by a mask; and etching an entirety of the peripheral circuit area.

* * * * *